(12) United States Patent
Wadhwa et al.

(10) Patent No.: US 9,225,317 B1
(45) Date of Patent: Dec. 29, 2015

(54) HIGH-SPEED LEVEL SHIFTER WITH VOLTAGE SWING PROTECTION

(71) Applicants: Sanjay K. Wadhwa, Noida (IN); Kulbhushan Misri, Gurgaon (IN)

(72) Inventors: Sanjay K. Wadhwa, Noida (IN); Kulbhushan Misri, Gurgaon (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/580,144

(22) Filed: Dec. 22, 2014

(51) Int. Cl.
| | |
|---|---|
| H03L 5/00 | (2006.01) |
| H03K 3/356 | (2006.01) |
| H03K 19/003 | (2006.01) |

(52) U.S. Cl.
CPC .... H03K 3/356104 (2013.01); H03K 19/00315 (2013.01)

(58) Field of Classification Search
None
See application file for complete search history.

(56) References Cited

U.S. PATENT DOCUMENTS

| | | | |
|---|---|---|---|
| 6,650,168 B1 | 11/2003 | Wang et al. | |
| 7,009,424 B2 | 3/2006 | Khan et al. | |
| 7,053,657 B1 | 5/2006 | Peng | |
| 7,227,400 B1 * | 6/2007 | Gillespie | H03K 19/00315 327/333 |
| 7,382,158 B2 | 6/2008 | Kimura | |
| 7,397,297 B2 | 7/2008 | Kimura | |
| 7,443,223 B2 | 10/2008 | Bajkowski et al. | |
| 7,446,566 B1 | 11/2008 | Chrudimsky | |
| 7,501,876 B2 | 3/2009 | Kimura | |
| 7,671,629 B2 | 3/2010 | Zhang et al. | |
| 7,683,668 B1 | 3/2010 | Thakur et al. | |
| 7,902,870 B1 | 3/2011 | Jiang | |
| 8,093,938 B2 | 1/2012 | Duby et al. | |
| 8,198,916 B2 | 6/2012 | Sood et al. | |
| 8,258,848 B2 | 9/2012 | Chen | |
| 8,350,592 B1 | 1/2013 | Malhan et al. | |
| 8,432,189 B1 | 4/2013 | Malhan et al. | |
| 8,436,671 B2 | 5/2013 | Chern et al. | |
| 8,497,726 B2 | 7/2013 | Ryu et al. | |
| 8,643,425 B2 * | 2/2014 | Chaudhry | H03K 3/356182 327/333 |
| 2012/0212256 A1 * | 8/2012 | Nicholas | H03K 19/018521 326/80 |

* cited by examiner

*Primary Examiner* — Long Nguyen
(74) *Attorney, Agent, or Firm* — Charles Bergere

(57) ABSTRACT

A level shifter operates using first and second input signals. When the first and second input signals are in respective first and second states, a first switching element is activated and an output node is pulled toward a first voltage, first pull-down protection and first pull-down switching elements are deactivated, a first protection node is connected to a first bias voltage, second pull-down protection and second pull-down switching elements are activated, and a second protection node is pulled to a second voltage. When the first and second input signals are in respective second and first states, the first switching element is deactivated, the first pull-down protection and first pull-down switching elements are activated, the output node and the first protection node are pulled toward the second voltage, the second pull-down protection and second pull-down switching elements are deactivated, and the second protection node is connected to the first bias voltage.

7 Claims, 2 Drawing Sheets

US 9,225,317 B1

HIGH-SPEED LEVEL SHIFTER WITH VOLTAGE SWING PROTECTION

BACKGROUND OF THE INVENTION

The present invention is directed to electronic circuitry and, more particularly, to voltage level shifters.

A semiconductor device, such as an integrated circuit (IC) or the like, may operate using multiple voltage levels. For example, an IC may have multiple internal modules having different functions and requiring different operating voltages. A voltage level shifter is a circuit that is used to convert signal levels to higher or lower voltages.

When an IC operating on a lower supply voltage communicates with an IC operating on a higher supply voltage, the transistors in the level shifter of the lower supply voltage IC can be subject to over-voltage stress. That is, voltage swings across the terminals of the transistors may exceed permissible levels, negatively impacting the reliability of the circuit and potentially causing damage to the IC.

It is therefore desirable to provide a level shifter which has built-in protection for withstanding over-voltage stresses while still maintaining high speed operation with low power consumption.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale.

In the drawings.

DETAILED DESCRIPTION OF THE INVENTION

In one embodiment, the present invention provides a level shifter operated using first and second input signals. The level shifter includes a first supply rail providing a first voltage and a second supply rail providing a second voltage different than the first voltage, a first switching element and a second switching element coupled to the first supply rail and in parallel with respect to each other, an output node connected in series with the first switching element and a bias node connected in series with the second switching element, a first protection switching element connected in series between the first switching element and the output node, and a second protection switching element connected in series between the second switching element and the bias node. The first and second protection switching elements each receive a bias control signal having a first bias voltage between the first and second voltages. A first pull-down protection switching element is connected in series between the output node and a first protection node, and a second pull-down protection switching element is connected in series between the second protection switching element and a second protection node. First and second pull-down switching elements are respectively connected in series between the first and second protection nodes and the second supply rail. When the first input signal is in a first state and the second input signal is in a second state, the first switching element is activated and the output node is pulled toward the first voltage, the first pull-down protection and first pull-down switching elements are deactivated, the first protection node is connected to the first bias voltage, the second pull-down protection and second pull-down switching elements are activated and the second protection node is pulled to the second voltage. When the first input signal is in the second state and the second input signal is in the first state, the first switching element is deactivated, the first pull-down protection and first pull-down switching elements are activated, the output node and the first protection node are pulled toward the second voltage, the second pull-down protection and second pull-down switching elements are deactivated, and the second protection node is connected to the first bias voltage.

Figure 1:
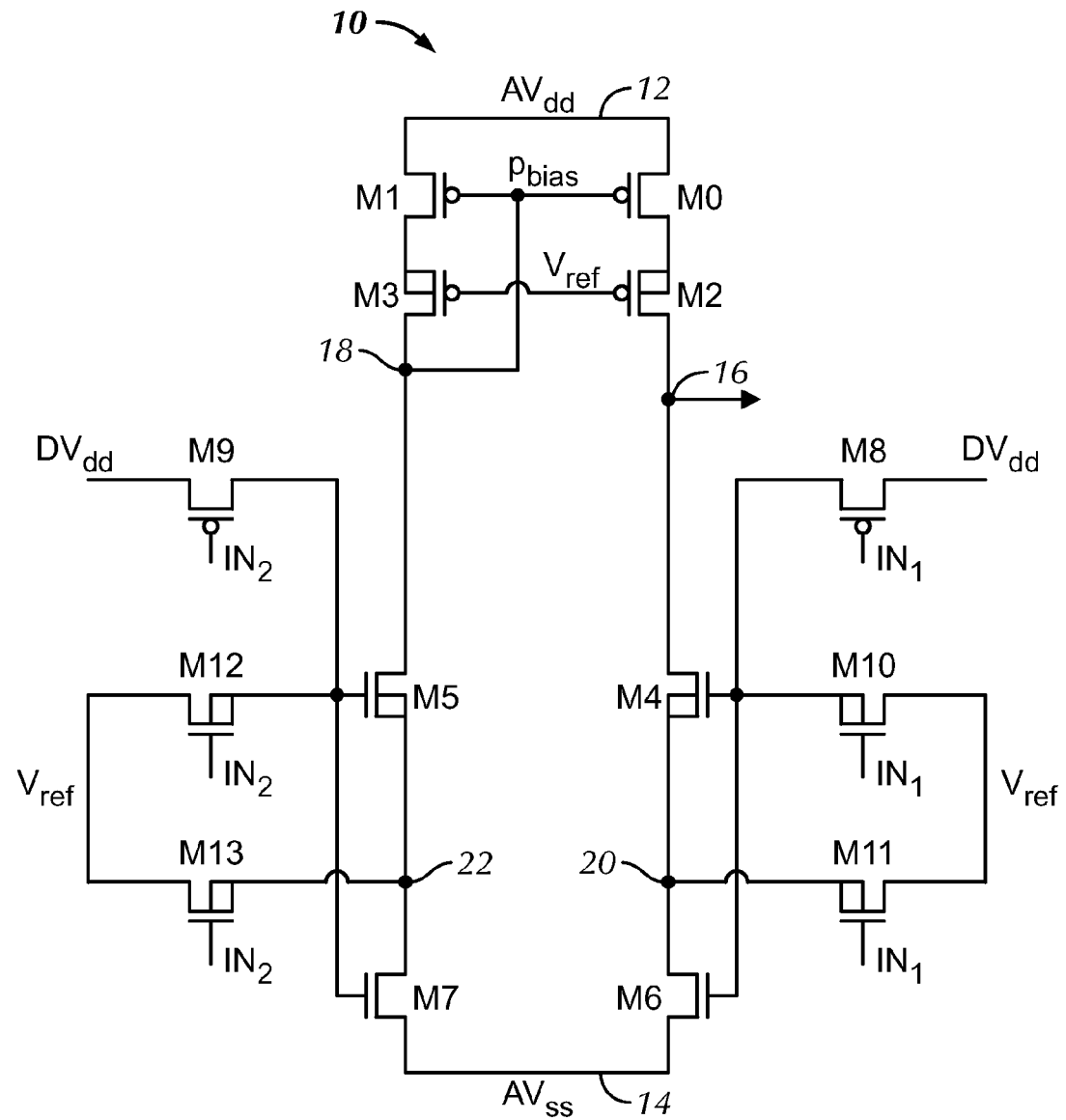
FIG. 1 is a schematic circuit diagram of a level shifter in accordance with a preferred embodiment of the present invention.

Referring now to the drawings, wherein the same reference numerals are used to designate the same components throughout the several figures, there is shown in FIG. 1 an embodiment of a level shifter 10 in accordance with the present invention. The level shifter 10 preferably includes first and second supply rails 12, 14, which respectively provide first and second voltages $AV_{dd}$, $AV_{ss}$. The first and second voltages $AV_{dd}$, $AV_{ss}$ are different from one another, and the second voltage $AV_{ss}$ is preferably ground. The first voltage $AV_{dd}$ is preferably the voltage to be output by the level shifter 10 (i.e., the "shifted" voltage). The level shifter 10 also receives a third voltage $DV_{dd}$, which preferably corresponds to the voltage being input. Depending on the connections to the level shifter 10, the first voltage $AV_{dd}$ may be higher than the third voltage $DV_{dd}$.

The level shifter 10 further includes first and second switching elements M0, M1, which are coupled to the first supply rail 12 and in parallel with respect to each other. The first and second switching elements M0, M1 are preferably p-type metal-oxide-semiconductor (MOS) or "PMOS" transistors, each having a source connected to the first supply rail 12.

Figure 2:
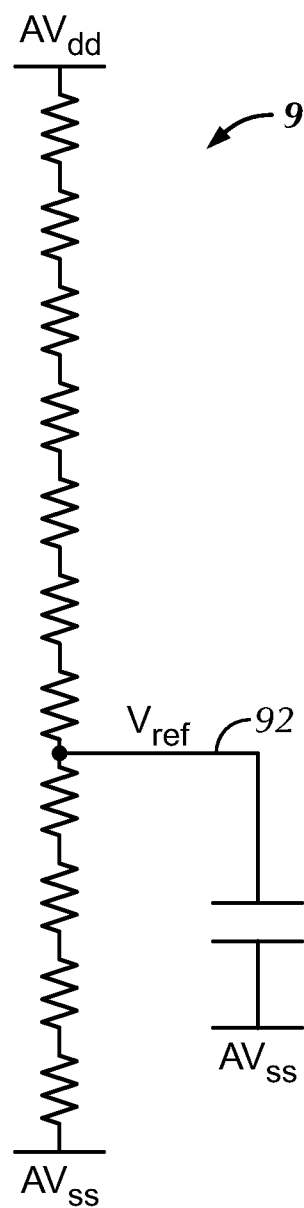
FIG. 2 is a schematic circuit diagram of a resistive voltage divider for use with the level shifter of FIG. 1.

First and second protection switching elements M2, M3 are also provided. It is preferred that the first and second protection switching elements M2, M3 are also in the form of PMOS transistors, with the source and bulk of each connected to a respective drain of one of the first and second switching elements M0, M1. Thus, the first protection switching element M2 lies in series between the first switching element M0 and an output node 16 of the level shifter 10. Similarly, the second protection switching element M3 lies in series between the second switching element M1 and a bias node 18 of the level shifter 10. Gates of the first and second protection switching elements M2, M3 preferably each receive a bias control signal having a first bias voltage $V_{ref}$ which preferably is between the first and second voltages $AV_{dd}$, $AV_{ss}$. In FIG. 2, the first bias voltage $V_{ref}$ is shown at an output 92 of a voltage divider 90 that is coupled between the first and second voltages $AV_{dd}$, $AV_{ss}$. However, other methods of generating the first bias voltage $V_{ref}$, such as from external supplies, may be used as well.

The gates of the first and second switching elements M0, M1 are controlled by a second bias voltage $p_{bias}$, which is present at bias node 18, which is connected to a drain of the second protection switching element M3. Thus, the second bias voltage $p_{bias}$ will vary as the level shifter 10 changes states and the bias node 18 is charged towards the first voltage $AV_{dd}$ through the second switching element M1 and second protection switching element M3 or discharged toward the second voltage $AV_{ss}$ through the second pull-down protection switching element M5 and the second pull-down switching element M7.

The level shifter 10 further includes first and second protection nodes 20, 22. A first pull-down protection switching element M4 is connected in series between the output node 16 and the first protection node 20. The first pull-down protection switching element M4 is preferably an n-type MOS or "NMOS" transistor having a drain connected to the output node 16 and a source and bulk connected to the first protection node 20. Similarly, a second pull-down protection switching element M5, preferably also an NMOS transistor, is connected in series in the same manner between the bias node 18 at the drain of the second protection switching element M3 and the second protection node 22. The first and second protection nodes 20, 22 are also selectively connectable to the first bias voltage $V_{ref}$, as described in more detail below.

First and second pull-down switching elements M6, M7, each preferably an NMOS transistor, are respectively connected in series between the first and second protection nodes 20, 22 and the second supply rail 14. The first pull-down protection switching element M4 and the first pull-down switching element M6 are each influenced by a first input signal $IN_1$, while the second pull-down protection switching element M5 and the second pull-down switching element M7 are each influenced by a second input signal $IN_2$.

In the embodiment shown in FIG. 1, a first pass-gate switching element M8 has a source connected to the third voltage $DV_{dd}$ and a drain connected to the gates of the first pull-down protection switching element M4 and the first pull-down switching element M6. A gate of the first pass-gate switching element M8 receives the first input signal $IN_1$. The first pass-gate switching element M8 is preferably a PMOS transistor, such that when the first input signal $IN_1$ is low, the first pass-gate switching element M8 is activated and passes the third voltage $DV_{dd}$ to the gates of the first pull-down protection switching element M4 and the first pull-down switching element M6. When the first input signal $IN_1$ is high, the first pass-gate switching element M8 is deactivated.

A second pass-gate switching element M9 similarly has a source connected to the third voltage $DV_{dd}$ and a drain connected to the gates of the second pull-down protection switching element M5 and the second pull-down switching element M7. A gate of the second pass-gate switching element M9 receives the second input signal $IN_2$. The second pass-gate switching element M9 is preferably also a PMOS transistor, such that when the second input signal $IN_2$ is low, the second pass-gate switching element M9 is activated and passes the third voltage $DV_{dd}$ to the gates of the second pull-down protection switching element M5 and the second pull-down switching element M7. When the second input signal $IN_2$ is high, the second pass-gate switching element M9 is deactivated. Of course, the first and second pass-gate switching elements M8, M9 can alternatively be NMOS transistors, in which case the activated and deactivated states would be reversed based on the first and second input signals $IN_1$, $IN_2$.

Figure 3:
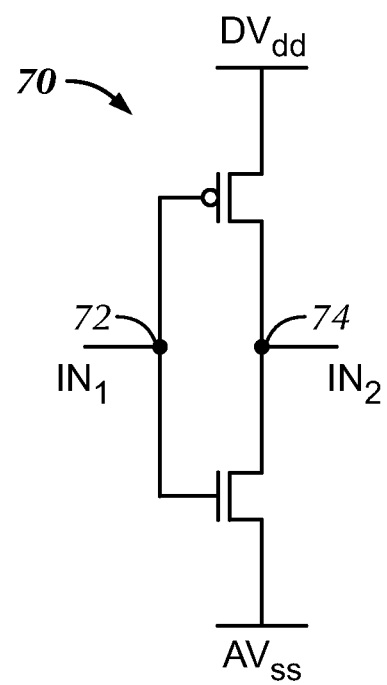
FIG. 3 is a schematic circuit diagram of a CMOS inverter for use with the level shifter of FIG. 1.

The first and second input signals $IN_1$, $IN_2$ are preferably the inverse of one another. For example, in one embodiment, a complementary MOS ("CMOS") inverter 70 (FIG. 3) may be provided that is preferably coupled between the third voltage $DV_{dd}$ and the second voltage $AV_{ss}$. However, other voltages may be utilized. The CMOS inverter 70 preferably receives the first input signal $IN_1$ as an input 72, and produces the second input signal $IN_2$ at its output 74. Other methods for generating the first and second input signals $IN_1$, $IN_2$ may be used as well.

Again referring to the embodiment of FIG. 1, first and second bias pass-gate switching elements M10, M11 may be provided. The first bias pass-gate switching element M10 is preferably an NMOS transistor with one end receiving the first bias voltage $V_{ref}$ and the other being connected to the gates of the first pull-down protection switching element M4 and the first pull-down switching element M6. The second bias pass-gate switching element M11 has one end receiving the first bias voltage $V_{ref}$ with the other end coupled to the first protection node 20.

Gates of the first and second bias pass-gate switching elements M10, M11 are connected to the first input signal $IN_1$. Since the first and second bias pass-gate switching elements M10, M11 are of an opposite conductivity type to the first pass-gate switching element M8, the first and second bias pass-gate switching elements M10, M11 are activated when the first pass-gate switching element M8 is deactivated, and vice versa. In this way, the gates of the first pull-down protection switching element M4 and the first pull-down switching element M6 may be alternately connected to the third voltage $DV_{dd}$ and the first bias voltage $V_{ref}$ for activation and deactivation, respectively.

Third and fourth bias pass-gate switching elements M12, M13 are provided on the opposite side of the level shifter 10 for connection with the second pull-down protection switching element M5, the second pull-down switching element M7, and the second protection node 22. The third and fourth bias pass-gate switching elements M12, M13 function similarly to the first and second bias pass-gate switching elements M10, M11, respectively, with the exception that gates of the third and fourth bias pass-gate switching elements M12, M13 are coupled to the second input signal $IN_2$.

Exemplary operation of the level shifter 10 will now be described with reference to the embodiment shown in FIG. 1. When the first input signal IN1 is in a first state (e.g., high) and the second input signal IN2 is in a second state (e.g., low), the second pass-gate switching element M9 is activated, which connects the gates of the second pull-down protection switching element M5 and the second pull-down switching element M7 to the third voltage $DV_{dd}$, thereby activating the second pull-down protection switching element M5 and the second pull-down switching element M7. As a result, the second protection node 22 is discharged to the second voltage $AV_{ss}$.

On the other side of the level shifter 10, the first pass-gate switching element M8 is deactivated, and the first and second bias pass-gate switching elements M10, M11 are activated. This connects the gates of the first pull-down protection switching element M4 and the first pull-down switching element M6 to the first bias voltage $V_{ref}$, causing deactivation. This isolates the output node 16 from the second supply rail 14. The first bias voltage $V_{ref}$ is also passed to the first protection node 20.

The activation of the second pull-down protection switching element M5 and the second pull-down switching element M7 also allows the bias node 18 at the drain of the second protection switching element M3 to discharge toward the second voltage $AV_{ss}$. This lowers the second bias voltage $p_{bias}$, causing activation of the first and second switching elements M0, M1. Since the gates of the first and second protection switching elements M2, M3 are connected to the first bias voltage $V_{ref}$ and are always conducting, the output node 16 will charge toward the first voltage $AV_{dd}$.

The level shifter 10 may thereafter change states such that the second input signal $IN_2$ is in the first state (e.g., high) and the first input signal $IN_1$ is in the second state (e.g., low). The second pass-gate switching element M9 is therefore deactivated, while the third and fourth bias pass-gate switching elements M12, M13 become activated. The gates of the second pull-down protection switching element M5 and the second pull-down switching element M7 are therefore coupled to the first bias voltage $V_{ref}$, causing their deactivation. The second protection node 22 is also connected to the first bias voltage $V_{ref}$.

On the other side of the level shifter 10, the first pass-gate switching element M8 is activated, and the first and second bias pass-gate switching elements M10, M11 are deactivated. The gates of the first pull-down protection switching element M4 and the first pull-down switching element M6 receive the third voltage $DV_{dd}$, causing activation. This connects the output node 16 to the second supply rail 14 and the second voltage $AV_{ss}$. The first protection node 20 is also permitted to discharge to the second voltage $AV_{ss}$ since it has been isolated from the first bias voltage $V_{ref}$.

Because the bias node 18 at the drain of the second protection switching element M3 is isolated from the second voltage $AV_{ss}$ and the second switching element M1 is initially activated (the second bias voltage $p_{bias}$ initially being low), the bias node 18 is connected to the first supply rail 12 and can begin to charge toward the first voltage $AV_{dd}$. As the second bias voltage $p_{bias}$ rises, the difference between the first voltage $AV_{dd}$ and the second bias voltage $p_{bias}$ starts decreasing and the first switching element M0 starts deactivating, isolating the output node 16 from the first supply rail 12. As a result, the output node 16 discharges toward the second voltage $AV_{ss}$. As the difference between the first voltage $AV_{dd}$ and the second bias voltage $p_{bias}$ becomes less than a threshold voltage $(V_t)$ of the PMOS transistor, the first switching element M0 will deactivate completely. It should be noted that the second switching element M1 will also start deactivating, leaving the bias node 18 at a steady level until the next change of state of the level shifter 10, thereby maintaining the deactivated state of the first and second switching elements M0, M1.

With the additions of the first and second protection switching elements M2, M3, the first and second pull-down protection switching elements M4, M5, and the use of the first bias voltage $V_{ref}$, over-voltage stress in the level shifter 10 can be avoided. Specifically, the voltage difference between any two terminals of the switching elements provided in the level shifter should not exceed a predetermined maximum during operation. For example, the first bias voltage $V_{ref}$ may be selected so that the voltage difference across any two terminals (e.g., source, drain, gate, body, or the like) of any switching element does not exceed the difference between the second and third voltages $AV_{ss}$, $DV_{dd}$. The precise voltage levels will vary depending on the requirements of the level shifter 10, the capabilities of the elements contained therein, and the like. Further, the first bias voltage $V_{ref}$ should be less than the threshold voltage $(V_t)$ of NMOS transistors (e.g., M4, M5) such that when the first bias voltage $V_{ref}$ is applied to a gate thereof the corresponding transistor will deactivate.

In the foregoing specification, the invention has been described with reference to specific examples of embodiments of the invention. It will, however, be evident that various modifications and changes may be made therein without departing from the broader spirit and scope of the invention as set forth in the appended claims.

The connections discussed may be any type of connection suitable to transfer signals from or to the respective nodes, units or devices, for example via intermediate devices. Accordingly, unless implied or stated otherwise, the connections may be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed. Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The switch elements are described in preferred embodiments as being transistors, but other types of switching circuitry, such as mechanical switches, relays, or the like may be used. In addition, while certain transistors are described as PMOS or NMOS type, the conductivities may be reversed in still keeping with the invention.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

In the claims, the word 'comprising' or 'having' does not exclude the presence of other elements or steps then those listed in a claim. Further, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A level shifter operated using first and second input signals, the level shifter comprising:
   a first supply rail providing a first voltage and a second supply rail providing a second voltage different than the first voltage;
   a first switching element and a second switching element coupled to the first supply rail and in parallel with respect to each other;
   an output node connected in series with the first switching element and a bias node connected in series with the second switching element;

a first protection switching element connected in series between the first switching element and the output node, and a second protection switching element connected in series between the second switching element and the bias node, the first and second protection switching elements each receiving a bias control signal having a first bias voltage between the first and second voltages;

a first pull-down protection switching element connected in series between the output node and a first protection node, and a second pull-down protection switching element connected in series between the second protection switching element and a second protection node; and first and second pull-down switching elements respectively connected in series between the first and second protection nodes and the second supply rail, wherein when the first input signal is in a first state and the second input signal is in a second state, the first switching element is activated and the output node is pulled toward the first voltage, the first pull-down protection and first pull-down switching elements are deactivated, the first protection node is connected to the first bias voltage, the second pull-down protection and second pull-down switching elements are activated and the second protection node is pulled to the second voltage, and wherein when the first input signal is in the second state and the second input signal is in the first state, the first switching element is deactivated, the first pull-down protection and first pull-down switching elements are activated, the output node and the first protection node are pulled toward the second voltage, the second pull-down protection and second pull-down switching elements are deactivated, and the second protection node is connected to the first bias voltage.

2. The level shifter of claim 1, further comprising:

a first pass-gate switching element connected to a third supply voltage that is between the first and second voltages, and controlled by the first input signal such that when the first input signal is in the second state, the third supply voltage is provided to activate the first pull-down protection and first pull-down switching elements; and a second pass-gate switching element connected to the third supply voltage, and controlled by the second input signal such that when the second input signal is in the second state, the third supply voltage is provided to activate the second pull-down protection and second pull-down switching elements.

3. The level shifter of claim 2, further comprising:

first and second bias pass-gate switching elements each controlled by the first input signal, wherein when the first input signal is in the first state, the first bias pass-gate switching element provides the first bias voltage to deactivate the first pull-down protection switching element and the first pull-down switching element and the second bias pass-gate switching element connects the first protection node to the first bias voltage; and third and fourth bias pass-gate switching elements each controlled by the second input signal, wherein when the second input signal is in the first state, the third bias pass-gate switching element provides the first bias voltage to deactivate the second pull-down protection switching element and the second pull-down switching element and the fourth bias pass-gate switching element connects the second protection node to the first bias voltage.

4. The level shifter of claim 3, wherein the second input signal is output from a CMOS inverter receiving the first input signal as an input and coupled between the second and third supply voltages.

5. The level shifter of claim 1, wherein the second input signal is output from a CMOS inverter receiving the first input signal as an input and coupled between the second supply voltage and a third supply voltage that is between the first and second supply voltages.

6. The level shifter of claim 1, wherein the first and second switching elements are controlled by a second bias voltage present at a node between the second protection switching element and the second pull-down protection switching element.

7. The level shifter of claim 1, further comprising a resistive voltage divider coupled between the first and second supply voltages, an output of the resistive voltage divider providing the first bias voltage.

* * * * *